United States Patent [19]

Main

[11] Patent Number: 5,650,749
[45] Date of Patent: Jul. 22, 1997

[54] FM DEMODULATOR USING INJECTION LOCKED OSCILLATOR HAVING TUNING FEEDBACK AND LINEARIZING FEEDBACK

[75] Inventor: William Eric Main, Mesa, Ariz.

[73] Assignee: Motorola, Inc., Schaumburg, Ill.

[21] Appl. No.: 660,828

[22] Filed: Jun. 10, 1996

[51] Int. Cl.[6] .................... H03D 3/00; H03L 7/083; H03L 7/093
[52] U.S. Cl. .................... 329/324; 329/326; 331/23
[58] Field of Search .................... 529/323–326; 331/23; 455/205, 208, 214, 337

[56] References Cited

U.S. PATENT DOCUMENTS

| | | | |
|---|---|---|---|
| 3,479,607 | 11/1969 | Ruthroff | 329/324 X |
| 3,676,786 | 7/1972 | Carlson | 329/324 X |
| 3,909,735 | 9/1975 | Anderson et al. | 331/23 X |
| 4,456,890 | 6/1984 | Carickhoff | 331/23 X |
| 4,479,091 | 10/1984 | Yoshisato | 331/23 X |
| 4,628,272 | 12/1986 | Davis et al. | 329/110 |
| 4,709,408 | 11/1987 | Itakura et al. | 455/260 |
| 4,953,010 | 8/1990 | Cowley | 358/35 |

OTHER PUBLICATIONS

V. Uzunoglu et al., IEEE Transactions on Circuits and Systems, "Synchronous and the Coherent Phase–Locked Synchronous Oscillators: New Techniques in Synchronization and Tracking", vol. 36, No. 7, Jul. 1989, pp. 997–1004.

*Primary Examiner*—David Mis
*Attorney, Agent, or Firm*—Rennie William Dover; Robert D. Atkins

[57] ABSTRACT

A demodulator circuit (100) and method for producing a demodulated signal $V_{OUT}$ from an input signal $V_{IN}$. A frequency detection circuit (101) produces a quadrature signal $V_{QUAD}$ which is compared to the input signal $V_{IN}$ to produce a detected output signal. The phase and frequency of the quadrature signal $V_{QUAD}$ are responsive to a control signal $I_{CONTROL}$. The demodulator circuit (100) has an output terminal (114) which provides the demodulated signal $V_{OUT}$. Nonlinearity in the demodulated output signal $V_{OUT}$ in relation to a modulating signal is reduced by a linearizing feedback circuit (102). Automatic tuning is provided by a tuning feedback circuit (103). The output signals produced at the respective output terminals (114) and (113) of the linearizing feedback circuit (102) and tuning feedback circuit (103) are summed to produce the control current $I_{CONTROL}$.

11 Claims, 1 Drawing Sheet

FM DEMODULATOR USING INJECTION LOCKED OSCILLATOR HAVING TUNING FEEDBACK AND LINEARIZING FEEDBACK

BACKGROUND OF THE INVENTION

The present invention relates, in general, to communications circuits and, more particularly, to demodulator circuits.

Frequency modulation (FM) is commonly used for transmitting information on a carrier signal in communications systems. A FM demodulator is used at the receiving end of the communications system to recover the transmitted information. FM demodulators are commonly used in radios, television, and cordless and cellular telephones.

FM demodulators generally use quadrature signals for recovering information from the transmitted FM signal. A quadrature signal is a signal shifted in phase by ninety degrees in relation to an input signal. In a FM demodulator, the quadrature signal is typically derived from the input FM signal by using an inductor-capacitor (LC) tank circuit. Accurate recovery of the modulating signal depends on the resonant frequency of the tank circuit being equal to the center frequency of the input signal. However, in order to attain the proper resonant frequency, manual tuning of the tank circuit is generally performed during fabrication of the receiver, which increases manufacturing cost. Tank circuits also have a disadvantage in that they are not readily integrated on a semiconductor die, thereby adding external components to the system and increasing system cost.

Ceramic filters, which are not tunable, are often used as an alternative to tank circuits for providing the quadrature signal. However, ceramic filters have lower performance than tank circuits. Moreover, they are difficult to obtain with an accurate resonant frequency, which further lowers receiver performance. They also increase system cost by not being integrated on a semiconductor die.

There is a need for a FM demodulator which does not require the use of tank circuits or ceramic filters to produce the quadrature signal. Receiver cost would thereby be reduced by eliminating the additional manual tuning needed with LC tank circuits while improving the performance attainable with ceramic filters. It would be a further benefit if the FM demodulator could be integrated on a semiconductor die, which would lower cost by reducing the number of external components.

DETAILED DESCRIPTION OF THE DRAWINGS

Modern frequency modulation (FM) demodulators typically rely on multiplying an in-phase input signal with a quadrature signal. The in-phase input signal is taken as the transmitted FM input signal and the quadrature signal is derived in the receiver from the transmitted input signal, typically by phase shifting the FM input signal. To facilitate receiver design, the transmitted FM signal is generally converted to an intermediate frequency (IF) input signal which retains the FM characteristic of the transmitted signal but has a lower center frequency. Accordingly, an IF signal is also considered to be a FM signal. Some typical IF signals have center frequencies of 455 kilohertz, 10.7 megahertz and 70 megahertz.

Figure 1:
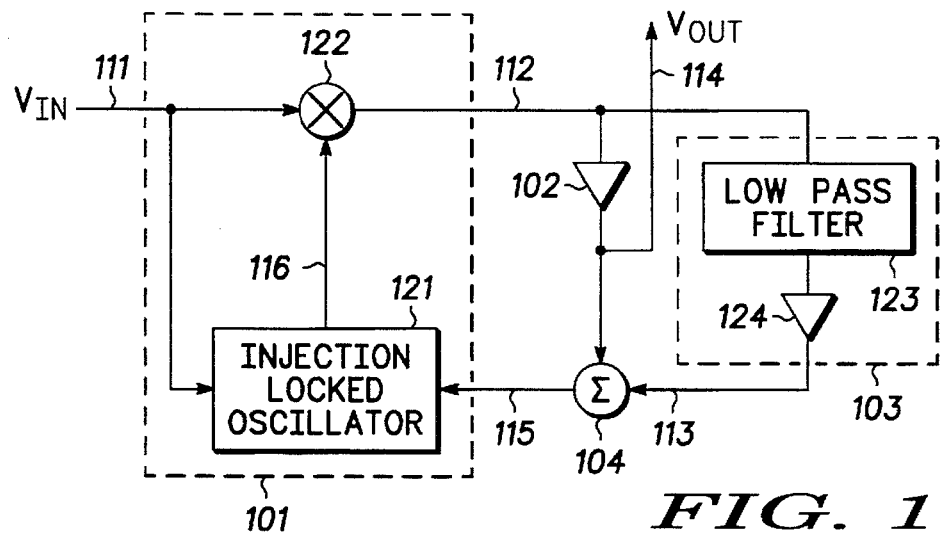
FIG. 1 is a block diagram of a FM demodulator circuit in accordance with the present invention.

FIG. 1 is a block diagram of a demodulator circuit 100 in accordance with the present invention. Demodulator circuit 100 comprises a frequency detection circuit 101, a linearizing feedback circuit 102, a tuning feedback circuit 103 and a summing circuit 104. Frequency detection circuit 101 has a signal input terminal 111 for receiving a modulated input signal $V_{IN}$, a control input terminal 115 for receiving a control signal and an output terminal 112 which provides a detection signal. Linearizing feedback circuit 102 has an input connected to output terminal 112 and an output terminal 114 which serves as the output of demodulator circuit 100. Output terminal 114 is connected to an input of a summing circuit 104. Tuning feedback circuit 103 has an input connected to output terminal 112 and an output connected to input terminal 113 of summing circuit 104. Summing circuit 104 has an output connected to control input terminal 115.

By way of example, frequency detection circuit 101 comprises a well known injection locked oscillator 121 connected to a well known phase detector circuit 122 by an output terminal 116. Injection locked oscillator 121 has an input terminal connected to signal input terminal 111 of frequency detection circuit 101, an input terminal 115 which serves to control its free running frequency, and an output terminal 116 which provides a quadrature signal or phase shifted signal $V_{QUAD}$. Phase detector circuit 122 has a first input connected to the signal input of demodulator circuit 100, a second input connected to the output of injection locked oscillator 121 and an output which serves as the output of frequency detection circuit 101. Alternative embodiments for frequency detection circuit 101 include a phase detector circuit combined with, for example, a tank circuit, a ceramic filter, or the like.

Phase detector circuit 122 is configured as a multiplier circuit, producing a detection signal at its output terminal 112 which corresponds to the product of input signal $V_{IN}$ and quadrature signal $V_{QUAD}$. By way of example, phase detector circuit 122 is configured as a well known doubly balanced multiplier circuit. The detection signal can be a single ended signal or, alternatively, a differential signal. It can be either a current signal or a voltage signal. When quadrature signal $V_{QUAD}$ is locked to the same frequency as input signal $V_{IN}$, the detection signal corresponds to the relative quadrature phase error, i.e., deviation in phase from true quadrature. In effect, phase detector circuit 122 measures the relative phase of input signal $V_{IN}$ and quadrature signal $V_{QUAD}$.

Input signal $V_{IN}$ and quadrature signal $V_{QUAD}$ are in quadrature, i.e., 90 degrees apart in phase, at the free running or center frequency of injection locked oscillator 121. When input signal $V_{IN}$ and quadrature signal $V_{QUAD}$ are in true quadrature, the detection signal corresponds to zero quadrature phase error. The product of input signal $V_{IN}$ and quadrature signal $V_{QUAD}$ also produces a frequency component in the detection signal at twice the frequency of input signal $V_{IN}$. This frequency component is commonly filtered out of the detection signal by a filter circuit in phase detector circuit 122 which attenuates frequency components which are at twice the frequency of input signal $V_{IN}$.

Injection locked oscillator 121, also referred to as a synchronous oscillator, has several advantages over a tank circuit or a ceramic filter for generating quadrature signal $V_{QUAD}$. It is better able to reject amplitude variations in FM input signal $V_{IN}$ and it produces less second harmonic distortion than other quadrature generating circuits. Its quadrature signal $V_{QUAD}$ more linearly corresponds to the modulating frequency of input signal $V_{IN}$ than do quadrature signals generated with methods using, for example tank circuits or ceramic filters. Thus, the modulating signal is recovered more accurately.

So long as the free running frequency of injection locked oscillator 121 is within the lock range of input signal $V_{IN}$, input signal $V_{IN}$ provides a synchronizing signal that constrains quadrature signal $V_{QUAD}$ to have the same frequency as input signal $V_{IN}$. Quadrature signal $V_{QUAD}$ thus contains component frequencies which correspond to input signal $V_{IN}$ and the free running frequency of injection locked oscillator 121. The combined frequencies are present in quadrature signal $V_{QUAD}$ even when the free running frequency is outside the lock range. As a result, injection locked oscillator 121 is capable of locking onto input signal $V_{IN}$ over a much wider frequency range than is achievable with tank circuits, ceramic filters, or the like.

The magnitude of the detection signal is a linear function of the quadrature phase error between input signal $V_{IN}$ and quadrature signal $V_{QUAD}$. In practice, however, circuit parasitics, such as stray capacitance in frequency detection circuit 101, introduce nonlinearities which distort the detection signal. Linearizing feedback circuit 102 provides a correction signal which reduces these nonlinearities by an amount equal to the magnitude of the resulting loop gain. Linearizing feedback circuit 102 comprises a gain stage which produces a linearizing signal which is applied to output terminal 114. Output terminal 114 serves as the output of the demodulator circuit 100, producing a demodulated output signal $V_{OUT}$. The linearizing signal is shown as a voltage signal but can alternatively be a current signal. It is a dynamic control signal which causes the frequency of output signal $V_{QUAD}$ to track the frequency of input signal $V_{IN}$. It can be either a single-ended or a differential signal. The reduction in quadrature phase error attributable to linearizing feedback circuit 102 results in an output signal $V_{OUT}$ which is more linear, and therefore more accurate than it would be without such feedback.

Tuning feedback circuit 103 senses the detection signal and provides a tuning correction signal for adjusting the free ruing frequency of injection locked oscillator 121 to be equal to the center frequency of input signal $V_{IN}$. When injection locked oscillator 121 produces a quadrature signal $V_{QUAD}$ which is at a different frequency than input signal $V_{IN}$, the detection signal has a low frequency or direct current (DC) component signal which indicates whether quadrature signal $V_{QUAD}$ has a higher or lower frequency than input signal $V_{IN}$. The DC component has one polarity when quadrature signal $V_{QUAD}$ has a higher frequency than input signal $V_{IN}$ and another polarity when quadrature signal $V_{QUAD}$ has a lower frequency than input signal $V_{IN}$. For example, the detection signal may have a positive DC component when quadrature signal $V_{QUAD}$ has a higher frequency than input signal $V_{IN}$ and a negative DC component when quadrature signal $V_{QUAD}$ has a lower frequency than input signal $V_{IN}$. The DC component is present even when $V_{QUAD}$ and $V_{IN}$ are not locked to the same frequency, thereby allowing the demodulator circuit 100 to be tuned even outside the lock range. Because the tuning correction signal corresponds to the average or center frequency of input signal $V_{IN}$, it provides an average control signal at input terminal 113 of summing circuit 104. The average control signal is fed back to control input 115 of frequency detection circuit 101 for adjusting the free running frequency of quadrature signal $V_{QUAD}$ to be in alignment with the center frequency of input signal $V_{IN}$.

Tuning feedback circuit 103 comprises a low-pass filter circuit 123 connected to an amplifier circuit 124. Output signal $V_{OUT}$ generally has a desired frequency band. The cutoff frequency of low pass filter circuit 123 is chosen to be below the desired frequency band of output signal $V_{OUT}$ such that signals within the desired frequency band are attenuated. Tuning feedback circuit 103 thus compensates for manufacturing tolerances as well as for thermal drift and similar effects which result in the free running frequency of injection locked oscillator 121 being different from the center frequency of input signal $V_{IN}$. Because of the filtering effect of low pass filter circuit 123, tuning feedback circuit 103 corrects only frequency errors of relatively long duration. Typically, a cutoff frequency from 1 hertz to 100 hertz is adequate.

Amplifier circuit 124 acts as a buffer to prevent summing circuit 104 from loading low pass filter circuit 123. It also serves as a gain stage for increasing the tuning accuracy of demodulator circuit 100. A tuning correction signal is provided at the output of amplifier circuit 124 which is shown as a single-ended voltage signal. However, in alternative embodiments the tuning correction signal can be a current signal or a differential signal.

Summing circuit 104 receives the linearizing signal and the tuning correction signal at its inputs and produces a control signal $I_{CONTROL}$ (not shown) at its output. Such summing circuits are well known and are implemented in a variety of ways. In the embodiment of FIG. 1, the linearizing and tuning correction signals are voltage signals and control signal $I_{CONTROL}$ is a current signal so that summing circuit 104 comprises either a resistor network or transconductance stages. Alternatively, if injection locked oscillator 121 is responsive to a control voltage rather than a control current, summing circuit 104 is a voltage gain stage which provides a control signal which is a voltage signal.

Control signal $I_{CONTROL}$ is applied to the control input of frequency detection circuit 101. Control signal $I_{CONTROL}$ is comprised of an average or DC component corresponding to the tuning correction signal and a dynamic or alternating current (AC) component corresponding to the linearizing signal. The DC component is comprised of frequencies below the desired frequency band of output signal $V_{OUT}$ and the AC component is comprised of frequencies within the desired frequency band. The DC component automatically tunes the free running frequency of injection locked oscillator 121 to equal the average or center frequency of input signal $V_{IN}$, thereby increasing the frequency margin of FM demodulator circuit 100. By feeding back the AC component, injection locked oscillator 121 is better able to track the input signal so the bandwidth can be reduced, thereby improving the sensitivity of demodulator circuit 100.

Figure 2:
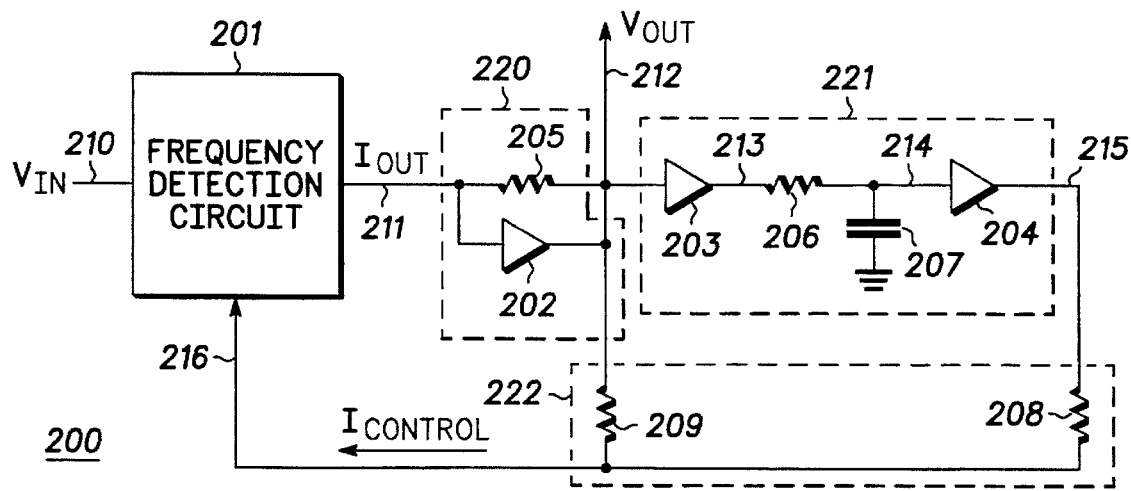
FIG. 2 is a schematic diagram of an embodiment of a FM demodulator circuit in accordance with the present invention.

FIG. 2 is a schematic diagram of an embodiment of demodulator circuit 200 in accordance with the present invention. Frequency detection circuit 201 has a signal input terminal 210 which receives a FM input signal $V_{IN}$, and a control input terminal 216 which receives a control signal $I_{CONTROL}$. An output terminal 211 provides an output signal current $I_{OUT}$.

A linearizing feedback circuit 220 is comprised of amplifier circuit 202 and resistor 205. Amplifier circuit 202 has an input connected to output terminal 211 and an output terminal 212 which serves as the output of the demodulator circuit 200. Resistor 205 is connected between output terminal 211 of frequency detection circuit 201 and output terminal 212 of linearizing feedback circuit 220.

A tuning feedback circuit 221 has an input connected to output terminal 212 and an output terminal 215. It is comprised of an amplifier circuit 203, which has an input which serves as the input of tuning feedback circuit 221 and an output terminal 213. Amplifier circuit 204 has an input terminal 214 and an output which serves as the output of tuning feedback circuit 221. A resistor 206 is connected between output terminal 213 of amplifier circuit 203 and input terminal 214 of amplifier circuit 204. Tuning feedback circuit 221 further includes a capacitor 207 connected between input terminal 214 of amplifier circuit 204 and a power supply voltage such as ground.

A summing circuit 222 is comprised of resistors 208 and 209. One input of summing circuit 222 is connected to terminal 212, another input is connected to output terminal 215 and an output applies a control current $I_{CONTROL}$ to input terminal 216 of frequency detection circuit 201. Resistor 209 is connected between terminals 212 and 216 and resistor 208 is connected between terminals 215 and 216. For proper operation, the input impedance at control input terminal 216 is substantially lower than the respective values of resistors 208 and 209 so as to minimize voltage fluctuations on control input terminal 216.

In operation, amplifier circuit 202 cooperates with resistor 205 to form a transimpedance gain stage which converts current signal $I_{OUT}$ to a voltage signal $V_{OUT}$. Voltage signal $V_{OUT}$ is then converted to a current signal by resistor 209, thereby producing a linearizing component of control current $I_{CONTROL}$ for feeding back to frequency detection circuit 201.

Amplifier circuit 203 is a buffer stage for preventing resistor 206 and capacitor 207 from loading terminal 212. Resistor 206 and capacitor 207 form a low pass filter circuit for attenuating component frequencies below the desired frequency band of output signal $V_{OUT}$. Resistor 206 and capacitor 207 are selected such that the cutoff frequency of the low pass filter is, for example, between 1 hertz and 100 hertz. Amplifier circuit 204 is a gain stage which provides voltage gain to improve the tuning accuracy of frequency detection circuit 201. Resistor 208 converts the voltage signal at terminal 215 to a current signal at terminal 216 which is summed with the current signal provided by resistor 209 to produce control current $I_{CONTROL}$ for adjusting the quadrature signal produced in frequency detection circuit 201.

Figure 3:
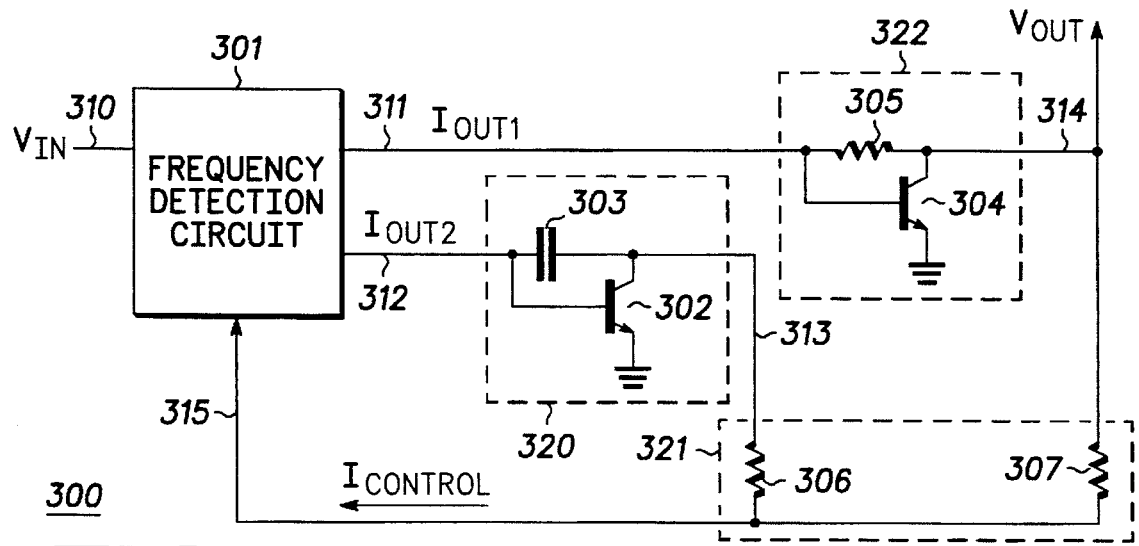
FIG. 3 is a schematic diagram of another embodiment of a FM demodulator in accordance with the present invention.

FIG. 3 is a schematic diagram of a demodulator circuit 300 in accordance with an alternative embodiment of the present invention. A frequency detection circuit 301 has a signal input terminal 310 which receives an input signal $V_{IN}$ and a control input at terminal 315 which receives a control signal $I_{CONTROL}$. An output terminal 311 provides an output signal $I_{OUT1}$ and an output terminal 312 provides an output signal $I_{OUT2}$. The respective output signals $I_{OUT1}$ and $I_{OUT2}$ commonly have the same amplitudes. If their amplitudes are not equal they are generally proportional to each other. $I_{OUT1}$ and $I_{OUT2}$ can be in phase or have opposite phases without substantially affecting the performance of demodulator circuit 300.

Transistor 304 has a base connected to terminal 311, a collector connected to terminal 314 and an emitter connected to a power supply voltage such as ground. Resistor 305 is connected between the base and collector of transistor 304. Transistor 302 has a base connected to terminal 312, a collector connected to terminal 313 and an emitter connected to a power supply voltage such as ground. Capacitor 303 is connected between the base and collector of transistor 302. Resistor 306 is connected between terminals 313 and 315 and resistor 307 is connected between terminals 314 and 315.

In operation, transistor 304 and resistor 305 form a linearizing feedback circuit 322 which is configured as a transimpedance amplifier, converting output signal $I_{OUT1}$, which is a current signal, to an output voltage $V_{OUT}$. The stage voltage of the transimpedance amplifier is calculated by multiplying the value of resistor 305 by the magnitude of output signal $I_{OUT1}$. Resistor 307 is used for converting output voltage $V_{OUT}$ to the linearizing component of the control current $I_{CONTROL}$.

Transistor 302 and capacitor 303 form a tuning feedback circuit 320 in demodulator circuit 300. The tuning feedback circuit 320 operates as an integrator circuit which combines low pass filter and amplifier functions in one stage. The input is terminal 312 and the output is terminal 313. The combination of transistor 302 and capacitor 303 provides a cutoff frequency for output signal $I_{OUT2}$ between one hertz and 100 hertz.

Summing circuit 321 is comprised of resistors 306 and 307. It converts the voltage signals on terminals 313 and 314, respectively, to currents which are summed at control input terminal 315 of frequency detection circuit 301. The result of the summing is control current $I_{CONTROL}$ which is applied to the control input of frequency detection circuit 301. Control signal $I_{CONTROL}$ adjusts the frequency of $V_{QUAD}$ when it is out of lock with input signal $V_{IN}$ and the phase of quadrature signal $V_{QUAD}$ when quadrature signal $V_{QUAD}$ is locked to input signal $V_{IN}$.

By now it should be appreciated that a circuit and a method have been provided for demodulating a transmitted input signal to produce a demodulated output signal. Improved performance results from automatic tuning provided by a tuning feedback circuit which eliminates the manual tuning required with tank circuits. Performance is further improved by using a linearizing feedback circuit to reduce quadrature phase error between the input and quadrature signals. Fabrication costs are lower because the demodulator circuit is readily integrated on a semiconductor die, thereby reducing the number of external components.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, the circuits herein are shown and described using NPN bipolar transistors. However, comparable performance may be achieved using other types of transistors, such as PNP bipolar transistors or P-channel or N-channel metal-oxide-semiconductor transistors, or other types of circuits such as operational amplifiers.

I claim:

1. A demodulator circuit, comprising:
   an injection locked oscillator having a first input coupled for receiving an input signal, and an output;
   a phase detector circuit having first and second inputs respectively coupled to the first input and output of the injection locked oscillator, and an output for providing an output signal;
   a linearizing feedback circuit having an input coupled to the output of the phase detector circuit and an output which serves as an output of the demodulator circuit;

a tuning feedback circuit having an input coupled to the output of the linearizing feedback and an output; and a summing circuit having first and second inputs and an output, the first input coupled to the output of the tuning feedback circuit, the second input coupled to the output of the linearizing feedback circuit and the output coupled to a second input of the injection locked oscillator.

2. The demodulator circuit of claim 1, wherein the phase detector circuit further comprises a filter circuit, the filter circuit attenuating frequencies at twice a frequency of the input signal.

3. The demodulator circuit of claim 1, wherein the tuning feedback circuit comprises a low pass filter coupled to a gain stage.

4. The demodulator circuit of claim 3, wherein the demodulator circuit has a desired frequency band and the low pass filter has a cutoff frequency below the desired frequency band.

5. The demodulator circuit of claim 1, wherein the tuning feedback circuit comprises:

a transistor having an emitter, a base and a collector, the base coupled to the of the linearizing feedback circuit, the collector coupled to the output of the tuning feedback circuit and the emitter coupled for receiving a power supply voltage; and a capacitor coupled between the base and the collector of the transistor.

6. The demodulator circuit of claim 1, wherein the linearizing feedback circuit comprises:

a transistor having an emitter, a base and a collector, the base coupled to the output of the phase detector circuit, the collector coupled to the output of the linearizing feedback circuit and the emitter coupled for receiving a power supply voltage; and a resistor coupled between the base and the collector of the transistor.

7. An integrated FM demodulator circuit having an input and an output, the input responsive to an input signal and the output providing an output signal, comprising:

an injection locked oscillator having first and second inputs and an output, the first input responsive to the input signal, the second input responsive to a control signal and the output providing a quadrature signal;

a phase detector circuit having first and second inputs and an output, the first input serving as the input of the integrated FM demodulator circuit, the second input responsive to the quadrature signal and the output providing a detection signal;

an amplifier circuit having an input and an output, the input responsive to the detection signal and the output serving as the output of the integrated FM demodulator circuit;

a tuning circuit having an input and an output, the input responsive to the detection signal and the output providing a tuning correction signal; and a summing circuit having first and second inputs and an output, the first input responsive to the output signal of the integrated FM demodulator circuit, the second input responsive to the tuning correction signal and the output providing the control signal.

8. The integrated FM demodulator circuit of claim 7, wherein the phase detector circuit comprises a multiplier circuit.

9. The integrated FM demodulator circuit of claim 8, wherein the multiplier circuit comprises a doubly balanced multiplier circuit.

10. The integrated FM demodulator circuit of claim 7, wherein the tuning circuit comprises a low pass filter circuit.

11. The integrated FM demodulator circuit of claim 10, wherein the output signal of the integrated FM demodulator circuit has a desired frequency band and a cutoff frequency of the low pass filter circuit is below the desired frequency band.

* * * * *

UNITED STATES PATENT AND TRADEMARK OFFICE
CERTIFICATE OF CORRECTION

PATENT NO. : 5,650,749
DATED : July 22, 1997
INVENTOR(S) : William Eric Main

It is certified that error appears in the above-indentified patent and that said Letters Patent is hereby corrected as shown below:

Claim 1, column 7, line 2,
After "feedback", insert --circuit-- therefor.

Claim 3, column 7, line 14
Delete "drcuit" and insert --circuit-- therefor.

Claim 5, column 7, line 23
after "the" (2nd occur.) add --output--.

Claim 8, column 8, line 25
Delete "drcuit" and insert --circuit-- therefor.

Claim 8, column 8, line 26
Delete "drcuit" and insert --circuit--therefor.

Claim 9, column 8, line 28
Delete "drcuit" and insert --circuit-- therefor.

Claim 10, column 8, line 31
Delete "drcuit" and insert --circuit-- therefor.

Signed and Sealed this

Twentieth Day of January, 1998

*Attest:*

*Attesting Officer*

BRUCE LEHMAN

*Commissioner of Patents and Trademarks*